US012733388B2

(12) United States Patent
Lee et al.

(10) Patent No.: US 12,733,388 B2
(45) Date of Patent: Sep. 8, 2026

(54) INK INCLUDING AN ORGANIC MATERIAL, DISPLAY DEVICE USING THE SAME, AND METHOD OF MANUFACTURING DISPLAY DEVICE

(71) Applicant: Samsung Display Co., Ltd., Yongin-si (KR)

(72) Inventors: Dongha Lee, Yongin-si (KR); Donghoon Kwak, Yongin-si (KR); Dukki Kim, Yongin-si (KR); Sehun Kim, Yongin-si (KR); Seoksoon Back, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/968,531

(22) Filed: Dec. 4, 2024

(65) Prior Publication Data

US 2025/0098436 A1 Mar. 20, 2025

Related U.S. Application Data

(60) Division of application No. 18/233,651, filed on Aug. 14, 2023, now Pat. No. 12,167,643, which is a (Continued)

(30) Foreign Application Priority Data

Jun. 11, 2020 (KR) ........................ 10-2020-0071012

(51) Int. Cl.
*C09D 11/30* (2014.01)
*C09K 11/06* (2006.01)
(Continued)

(52) U.S. Cl.
CPC ........... *H10K 71/135* (2023.02); *C09D 11/30* (2013.01); *C09K 11/06* (2013.01); *H10K 59/122* (2023.02);
(Continued)

(58) Field of Classification Search
CPC ......... C09D 11/30; C09D 11/33; C09D 11/52; C09D 11/326
See application file for complete search history.

(56) References Cited

U.S. PATENT DOCUMENTS 8,174,000 B2 5/2012 Cheon et al.
8,974,702 B2 3/2015 May et al.
(Continued)

FOREIGN PATENT DOCUMENTS

CN 1741693 A 3/2006
CN 1971967 5/2007
(Continued)

OTHER PUBLICATIONS

Progress of OLEDs prepared by inkjet printing, Chinese Optics, dated Apr. 9, 2020, in Chinese Patent Application No. 202110652099.3.

(Continued)

*Primary Examiner* — Khanh T Nguyen
(74) *Attorney, Agent, or Firm* — CANTOR COLBURN LLP

(57) ABSTRACT

An ink for a display device, the ink includes: an organic material, wherein the organic material has a molecular weight greater than about 500 and less than about 1,000,000, and the organic material in the ink has a concentration and the molecular weight of the organic material satisfy:

$$y < -3.518 * \ln(x) + 45.59,$$

(Continued)

wherein y is the concentration of the organic material, and x is the molecular weight of the organic material.

7 Claims, 10 Drawing Sheets

Related U.S. Application Data continuation of application No. 17/157,962, filed on Jan. 25, 2021, now Pat. No. 11,778,864.

(51) Int. Cl.
*H10K 59/122* (2023.01)
*H10K 71/13* (2023.01)
*H10K 85/10* (2023.01)
*H10K 59/12* (2023.01)

(52) U.S. Cl.
CPC ....... *H10K 85/141* (2023.02); *H10K 59/1201* (2023.02)

(56) References Cited

U.S. PATENT DOCUMENTS

| | | | | |
|---|---|---|---|---|
| 8,980,678 | B2 | 3/2015 | Nanno et al. | |
| 9,093,650 | B2 | 7/2015 | Kim et al. | |
| 9,153,782 | B2 | 10/2015 | Nanno et al. | |
| 9,318,722 | B2 | 4/2016 | Nanno et al. | |
| 9,450,211 | B2 | 9/2016 | Ahn et al. | |
| 9,909,022 | B2 | 3/2018 | Jain et al. | |
| 10,326,111 | B2 | 6/2019 | Yoo et al. | |
| 10,347,869 | B2 | 7/2019 | Ahn et al. | |
| 11,101,431 | B2 | 8/2021 | Kishimoto et al. | |
| 2006/0045959 | A1 | 3/2006 | Akiko et al. | |
| 2007/0114525 | A1 | 5/2007 | Lee et al. | |
| 2007/0263164 | A1 | 11/2007 | Kumagai | |
| 2007/0276060 | A1* | 11/2007 | Stancik | C09D 11/30 523/160 |
| 2013/0285032 | A1 | 10/2013 | Nanno et al. | |
| 2014/0008642 | A1 | 1/2014 | Takayuki et al. | |
| 2017/0018600 | A1 | 1/2017 | Ito et al. | |
| 2017/0200899 | A1 | 7/2017 | Kim et al. | |
| 2018/0248154 | A1 | 8/2018 | Shirahase et al. | |
| 2020/0303648 | A1 | 9/2020 | Nishioka et al. | |
| 2021/0391394 | A1* | 12/2021 | Lee | H10K 59/122 |
| 2023/0389366 | A1* | 11/2023 | Lee | C09D 11/30 |

FOREIGN PATENT DOCUMENTS

| | | | | | |
|---|---|---|---|---|---|
| CN | 103459521 | | | 12/2013 | |
| CN | 104253244 | A | | 12/2014 | |
| JP | 4765857 | | | 9/2011 | |
| JP | 6530144 | | | 6/2019 | |
| KR | 20070074080 | A | * | 7/2007 | G02F 1/13 |
| KR | 1020150001183 | A | | 1/2015 | |
| KR | 20160037242 | A | * | 4/2016 | H05B 33/02 |
| KR | 10-2017-0036701 | | | 4/2017 | |
| KR | 10-1751873 | | | 6/2017 | |
| WO | 2011-076325 | | | 6/2011 | |
| WO | WO 2012132863 | A1 | * | 10/2012 | C09K 11/06 |
| WO | 2016-014690 | | | 1/2016 | |
| WO | 2019-106716 | | | 6/2019 | |

OTHER PUBLICATIONS

Progress in Polymer Light-Emitting Displays by Ink-Jet Printing, Chinese Journal of Liquid Crystals and Displays, dated Jun. 15, 2009, in Chinese Patent Application No. 202110652099.3.

High Performance Inkjet OLED Materials and Techniques : Development Status, Tianjin Science & Technology, dated Nov. 15, 2016, in Chinese Patent Application No. 202110652099.3.

Notice of Allowance dated Mar. 17, 2023, in U.S. Appl. No. 17/157,962.

* cited by examiner

INK INCLUDING AN ORGANIC MATERIAL, DISPLAY DEVICE USING THE SAME, AND METHOD OF MANUFACTURING DISPLAY DEVICE

CROSS-REFERENCE TO RELATED APPLICATION

This is a divisional application of U.S. patent application Ser. No. 18/233,651 filed Aug. 14, 2023 (now pending), the disclosure of which is incorporated herein by reference in its entirety. U.S. patent application Ser. No. 18/233,651 is a continuation of U.S. patent application Ser. No. 17/157,962, filed on Jan. 25, 2021, now U.S. Pat. No. 11,778,864, issued Oct. 3, 2023, the disclosure of which is incorporated herein by reference in its entirety. U.S. patent application Ser. No. 17/157,962 which claims priority from and the benefit of Korean Patent Application No. 10-2020-0071012, filed on Jun. 11, 2020, each of which is hereby incorporated by reference for all purposes as if fully set forth herein.

BACKGROUND

Field

Exemplary implementations of the invention relate generally to a display device and a method of manufacturing the display device, and more particularly, to an ink including an organic material, a display device using the same, and a method of manufacturing the display device.

Discussion of the Background

With the development of the information society, the demand for display devices for displaying images has increased in various forms. In the field of display devices, bulky cathode ray tubes (CRTs) have rapidly been replaced by thin, light, and large-sized flat-panel display (FPD) devices. Flat-panel displays may include liquid crystal displays (LCDs), plasma display panels (PDPs), organic light-emitting device (OLED) displays, electrophoretic display (EPD) devices, or the like.

Of the above display devices, an organic light-emitting display device may include, as a display element, an organic light-emitting diode including an opposite electrode, a pixel electrode, and an emission layer. When a voltage is applied to the opposite electrode and the pixel electrode of the organic light-emitting diode, the emission layer may emit visible light. An intermediate layer of the organic light-emitting diode may be formed by discharging ink containing an organic material onto the pixel electrode.

The above information disclosed in this Background section is only for understanding of the background of the inventive concepts, and, therefore, it may contain information that does not constitute prior art.

SUMMARY

Applicant discovered that, in a display device according to the related art, when the molecular weight of an organic material forming the intermediate layer is low, adjacent pixels are contaminated in heating processes during manufacture.

An ink including an organic material, a display device using the same, and a method of manufacturing display device according to principles and exemplary implementations of the invention are capable of improving reliability of the display device and simultaneously increasing efficiency during manufacturing, by specific physical properties of organic material in the ink that may be obtained, for example, by correlating the viscosity of ink, the concentration of ink, and the molecular weight of the organic material contained in the ink, to deduce the relationship between the concentration of ink and the molecular weight of the organic material that produce technical benefits such as high resolution and reduction or elimination of contamination between adjacent pixels.

Additional features of the inventive concepts will be set forth in the description which follows, and in part will be apparent from the description, or may be learned by practice of the inventive concepts.

According to one aspect of the invention, an ink for a display device, the ink includes: an organic material, wherein the organic material has a molecular weight greater than about 500 and less than about 1,000,000, and the organic material in the ink has a concentration and the molecular weight of the organic material satisfy:

$$y < -3.518 * \ln(x) + 45.59,$$

wherein y is the concentration of the organic material, and x is the molecular weight of the organic material.

The molecular weight of the organic material may be greater than about 500 and less than about 400,000.

The ink may have an Ohnesorge number of less than about 1.

The viscosity of the ink may be less than or equal to about 25 cP.

According to another aspect of the invention, a display device includes: a substrate; a pixel electrode disposed on the substrate; a bank layer disposed on the pixel electrode, the bank layer including an opening exposing at least part of the pixel electrode; and an intermediate layer overlapping the opening and including an organic material, wherein the intermediate layer is disposed on the pixel electrode at least partially exposed by the bank layer, the organic material has a molecular weight greater than about 500 and less than about 1,000,000, and the organic material comprises ink having a concentration and the molecular weight of the organic material satisfy:

$$y < -3.518 * \ln(x) + 45.59,$$

wherein y is the concentration of the organic material, and x is the molecular weight of the organic material.

The molecular weight of the organic material may be greater than about 500 and less than about 400,000.

The ink may have an Ohnesorge number of less than about 1.

The viscosity of the ink may be less than or equal to about 25 cP.

An upper surface of the bank layer may have liquid repellency.

An upper surface and a lateral surface of the bank layer may have liquid repellency.

The bank layer may include a fluorine resin.

The bank layer may include a negative photoresist.

The intermediate layer may be disposed in an opening of the bank layer.

An opposite electrode may be disposed on the intermediate layer.

The opposite electrode may cover the intermediate layer and the bank layer.

According to a further aspect of the invention, a method of manufacturing a display device, the method including the steps of: forming a pixel electrode on a substrate; forming a bank layer on the pixel electrode, the bank layer having an opening exposing at least part of the pixel electrode; and forming an intermediate layer on the pixel electrode by discharging ink comprising an organic material onto the pixel electrode, wherein the organic material has a molecular weight greater than about 500 and less than about 1,000,000, and the organic material in the ink has a concentration and the molecular weight of the organic material satisfy:

$$y < -3.518 * \ln(x) + 45.59,$$

wherein y is the concentration of the organic material, and x is the molecular weight of the organic material.

The molecular weight of the organic material may be greater than about 500 and less than about 400,000.

The ink may have an Ohnesorge number of less than about 1.

The viscosity of the ink may be less than or equal to about 25 cP.

The step of forming the bank layer may include: forming a photoresist layer on the pixel electrode; exposing at least part of the photoresist layer; and forming the bank layer by at least partially exposing the photoresist layer.

The opening of the bank layer may be formed by developing the photoresist layer.

The intermediate layer may be disposed in the opening of the bank layer.

After the forming of the bank layer, the step of heating the bank layer may be conducted.

An upper surface of the bank layer may have liquid repellency.

An upper surface and a lateral surface of the bank layer may have liquid repellency.

The bank layer may include a fluorine resin.

The bank layer may include a negative photoresist.

After the forming of the intermediate layer, the step of forming an opposite electrode on the intermediate layer may be conducted.

The opposite electrode may cover the intermediate layer and the bank layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
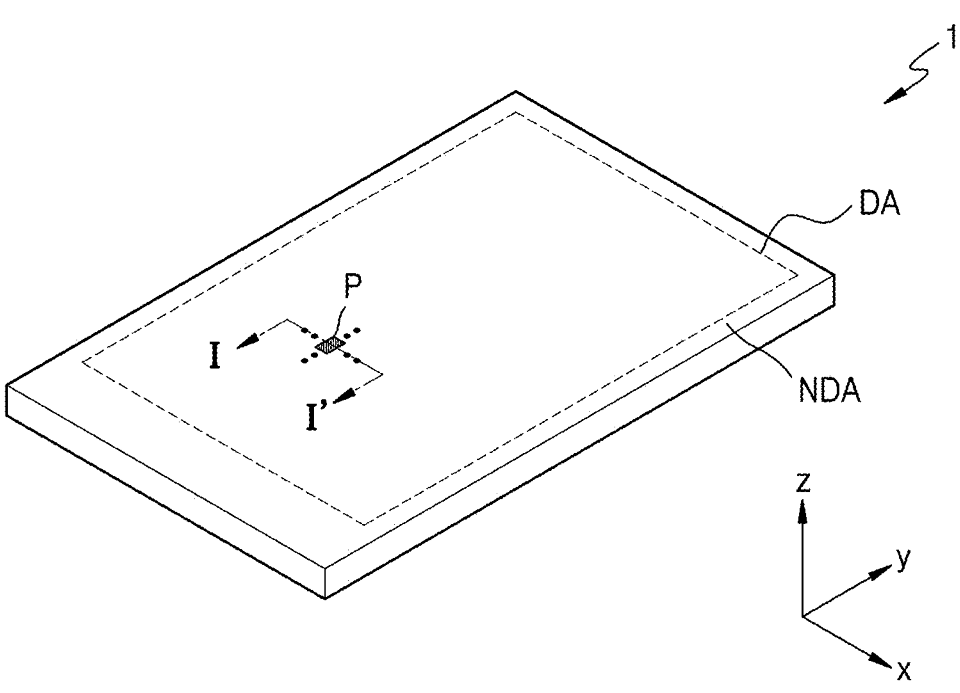
FIG. 1 is a schematic perspective view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, plates, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. Furthermore, the expression such as "at least one of A and B" may include A, B, or A and B.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As an example, the meaning that the wiring "extends in the first direction or the second direction" includes not only extending in a generally linear shape, but also extending generally in a zigzag or a curve along the first direction or the second direction.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting. Moreover, when referred to as "on a plane" or "on a plan view," this may mean when an object part is viewed from above, and it may be referred to as "in a cross-section," when the object part is cut vertically and viewed from the side. Also, when referred to as "overlapping," it may include overlapping "on a plane," "on a plan view," and "in a cross-section."

As used herein, the term "concentration" can mean the amount of a given substance in a state unit or mixture, solution, or ore and have a weight basis.

As used herein, the term "molecular weights" can mean "weight average molecular weight" or "number average molecular weight".

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As described herein, irrelevant portions to the description are omitted, and in the description with reference to the drawings, the same or corresponding constituents are indicated by the same reference numerals and redundant descriptions thereof are omitted.

FIG. 1 is a schematic perspective view illustrating an exemplary embodiment of a display device constructed according to principles of the invention.

Referring to FIG. 1, the display device 1 may include a display area DA and a non-display area NDA disposed around the display area DA. The non-display area NDA may surround the display area DA. The display device 1 may provide an image by using light emitted from a plurality of pixels P disposed in the display area DA, and the non-display area NDA may be an area where no image is displayed.

In the following description, although an organic light-emitting display device is described as an example of the display device 1, exemplary embodiments are not limited thereto. In some exemplary embodiments, the display device 1 may include a display device such as an inorganic light-emitting display device, an inorganic display device, or a quantum dot light-emitting display device. For example, the emission layer of a display element provided in the display device 1 may include an organic material, an inorganic material, a quantum dot, an organic material and a quantum dot, or an inorganic material and a quantum dot.

Although FIG. 1 illustrates the display device 1 having a generally flat display surface, but the exemplary embodiments are not limited thereto. In some embodiments, the display device 1 may include a three-dimensional display surface or a generally curved display surface.

When the display device 1 includes a three-dimensional display surface, the display device 1 may include a plurality of display areas indicating different directions, for example, a generally polygonal column type display surface. In some exemplary embodiments, when the display device 1 includes a generally curved display surface, the display device 1 may be embodied in various forms including flexible, foldable, and rollable display devices.

FIG. 1 illustrates the display device 1 in the form of a mobile phone terminal. The display device also may be in the form of electronic modules, such as a camera module, a power module, or the like, which are mounted on a main board, are disposed in the bracket/case together with the display device 1. In particular, the display device 1 may be in the form of small and medium-sized electronic devices such as tablets, car navigation devices, game machines, smart watches, or the like, as well as large electronic devices such as televisions and monitors.

Although FIG. 1 illustrates a case in which the display area DA of the display device 1 is generally rectangular, the shape of the display area DA may be generally circular, generally oval, or generally polygonal such as generally triangular or generally pentagonal.

The display device 1 may include the pixels P disposed in the display area DA. Each of the pixels P may include an organic light-emitting diode (OLED). Each of the pixels P may emit light of, for example, a red, green, blue, or white color through the OLED. In some exemplary embodiments, the representative pixel P may be a pixel that emits light of any one color of red, green, blue, or white, as described above.

Figure 2:
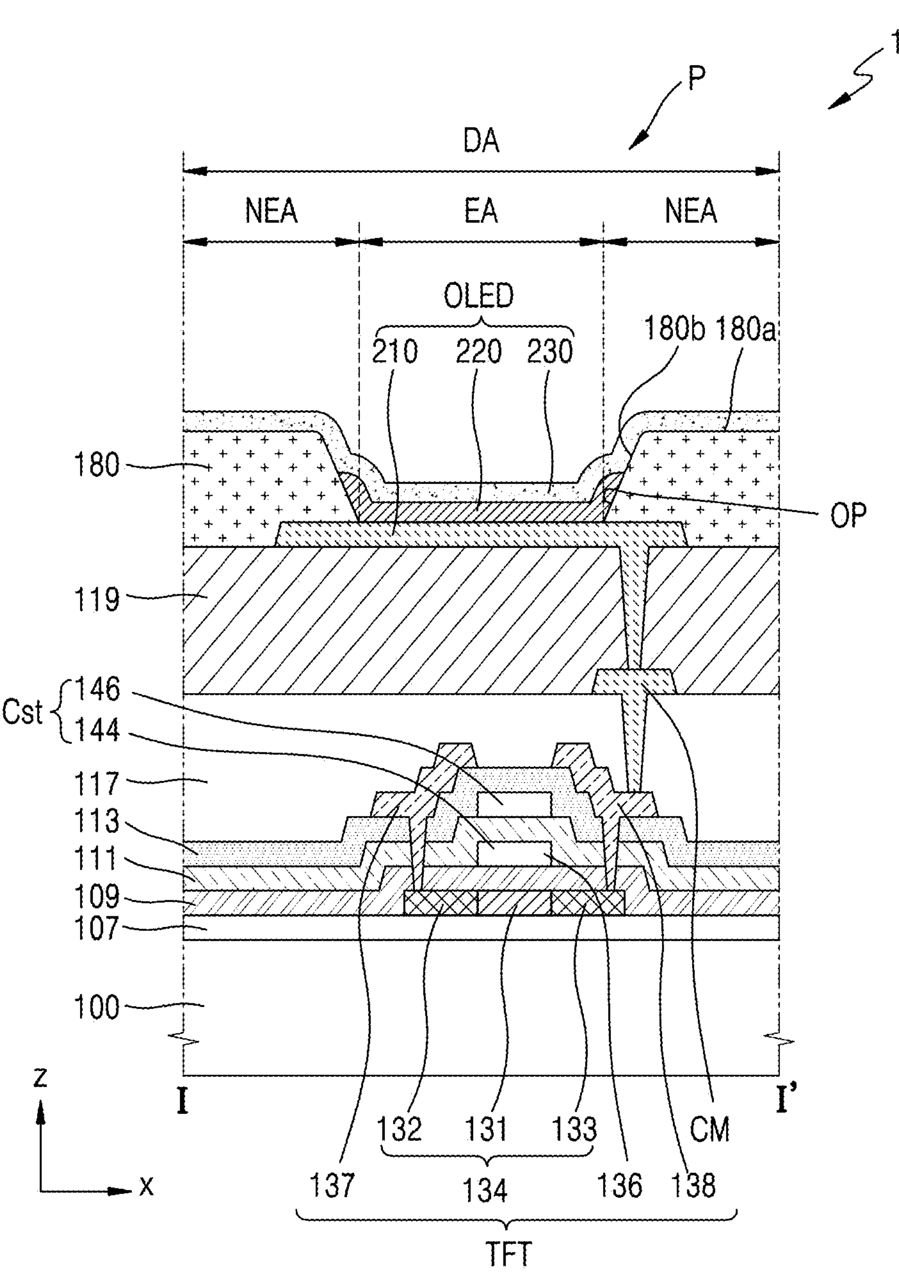
FIG. 2 is a schematic cross-sectional view of the display device taken along a line I-I' of FIG. 1.

FIG. 2 is a schematic cross-sectional view of the display device taken along a line I-I' of FIG. 1.

Referring to FIG. 2, the display device 1 may include a substrate 100 and the OLED disposed on the substrate 100. In the following description, detailed descriptions are presented in a stacking order of the display device 1 according to some exemplary embodiments.

The substrate 100 may include a glass material, a ceramic material, a metal material, or a material having flexible or bendable characteristics. When the substrate 100 has flexible or bendable characteristics, the substrate 100 may include a polymer resin such as a polyethersulfone, a polyacrylate, a polyetherimide, a polyethylene naphthalate, a polyethylene terephthalate, a polyphenylene sulfide, a polyarylate, polyimide, a polycarbonate, or a cellulose acetate propionate. The substrate 100 may have a single layer or a multilayer structure of the above material, and for a multilayer structure, an inorganic layer may be further included. In some exemplary embodiments, the substrate 100 may have a structure of an organic material/an inorganic material/an organic material.

A buffer layer 107 may be disposed on the substrate 100. The buffer layer 107 is located on the substrate 100 to reduce or prevent intrusion of foreign materials, moisture, or external air from the bottom of the substrate 100, and may provide a planarized surface on the substrate 100. The buffer layer 107 may include an inorganic material such as an oxide or a nitride, an organic material, or an organic/inorganic composite, and may have a single layer or a multilayer structure of an inorganic material and an organic material.

A barrier layer may be further provided between the substrate 100 and the buffer layer 107. The barrier layer may prevent or reduce intrusion of impurities from the substrate 100 or the like into a semiconductor layer 134 that is described below. The barrier layer may include an inorganic material such as an oxide or a nitride, an organic material, or an organic/inorganic composite, and may have a single layer or a multilayer structure of an inorganic material and an organic material.

A thin film transistor TFT may be disposed on the buffer layer 107. The TFT may include the semiconductor layer 134, a gate electrode 136 overlapping the semiconductor layer 134, and connection electrodes electrically connected to the semiconductor layer 134. The TFT is connected to the OLED to drive the OLED.

The semiconductor layer 134 is disposed on the buffer layer 107, and may include a channel region 131 overlapping with the gate electrode 136, and a source region 132 and a drain region 133 disposed at both sides of the channel region 131 and including impurities of a concentration higher than that of the channel region 131. The impurities may include a N-type impurities or a P-type impurities. The source region 132 and the drain region 133 may be electrically connected to the connection electrodes.

The semiconductor layer 134 may include an oxide semiconductor and/or a silicon semiconductor. When the semiconductor layer 134 includes an oxide semiconductor, for example, an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may include ITZO (InSnZnO), IGZO (InGaZnO), or the like. When the semiconductor layer 134 includes a silicon semiconductor, for example, an amorphous silicon (a-Si) or a low temperature polysilicon (LTPS) obtained by crystallizing the amorphous silicon (a-Si).

A first insulating layer 109 may be disposed on the semiconductor layer 134. The first insulating layer 109 may include at least one inorganic insulating material selected from the group consisting of silicon oxide ($SiO_2$), a silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 109 may be a single layer or a multilayer including the above-described inorganic insulating material.

The gate electrode 136 may be disposed on the first insulating layer 109. The gate electrode 136 may be formed in a single layer or a multilayer including at least one metal material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be connected to a gate line for applying an electrical signal to the gate electrode 136.

A second insulating layer 111 may be disposed on the gate electrode 136. The second insulating layer 111 may include at least one inorganic insulating material selected from the group consisting of $SiO_2$, a $SiN_x$, SiON, $Al_2O_3$, $TiO_2$, $Ta_2O_5$, $HfO_2$, and $ZnO_2$. The second insulating layer 111 may be a single layer or a multilayer including the above-described inorganic insulating material.

A storage capacitor Cst may be disposed on the first insulating layer 109. The storage capacitor Cst may include a lower electrode 144 and an upper electrode 146 overlapping with the lower electrode 144. The lower electrode 144 and the upper electrode 146 of the storage capacitor Cst may overlap with each other with the second insulating layer 111 therebetween.

In some exemplary embodiments, the lower electrode 144 of the storage capacitor Cst overlaps with the gate electrode 136 of the TFT, and the lower electrode 144 of the storage capacitor Cst may be provided integrally with the gate electrode 136 of the TFT. In another exemplary embodiment, the lower electrode 144 of the storage capacitor Cst does not overlap with the gate electrode 136 of the TFT, and may be disposed, as a separate independent constituent element, on the first insulating layer 109 or the second insulating layer 111.

The upper electrode 146 of the storage capacitor Cst may include Al, Pt, Pd, Ag, Mg, Au, Ni, Nd, Ir, Cr, Li, Ca, Mo, Ti, W, and/or Cu, and may be a single layer or a multilayer of the above-described material.

A third insulating layer 113 may be disposed on the upper electrode 146 of the storage capacitor Cst. The third insulating layer 113 may include at least one inorganic insulating material selected from the group consisting of $SiO_2$, a $SiN_x$, SiON, $Al_2O_3$, $TiO_2$, $Ta_2O_5$, $HfO_2$, and $ZnO_2$. The third insulating layer 113 may be a single layer or a multilayer including the above-described inorganic insulating material.

A source electrode 137 and a drain electrode 138, which are the connection electrodes, may be disposed on the third insulating layer 113. The source electrode 137 and the drain electrode 138 may include a conductive material including Mo, Al, Cu, Ti, or the like, and may be formed in a single layer or a multilayer including the above materials. The source electrode 137 and the drain electrode 138 may have a multilayer structure of Ti/Al/Ti.

A first planarization layer 117 may be disposed on the source electrode 137 and the drain electrode 138. The first planarization layer 117 may be formed in a single layer or a multilayer of a film including an organic material or an inorganic material. In some exemplary embodiments, the first planarization layer 117 may include general purpose polymers such as benzocyclobutene (BCB), polyimide (PI), hexamethyldisiloxane (HMDSO), polymethylmethacrylate (PMMA), and polystyrene (PS), polymer derivatives with phenolic groups, acrylic polymers, imide polymers, aryl ether polymers, amide polymers, fluorine polymers, p-xylene polymers, vinyl alcohol polymers, blends thereof, or the like. The first planarization layer 117 may include $SiO_2$, a $SiN_x$, SiON, $Al_2O_3$, $TiO_2$, $Ta_2O_5$, $HfO_2$, $ZnO_2$, or the like. After the first planarization layer 117 is formed, chemical mechanical polishing may be performed to provide a planarized upper surface.

A contact metal layer CM may be disposed on the first planarization layer 117. The contact metal layer CM may include Al, Cu, Ti, or the like, and may be formed in a single layer or a multilayer. The contact metal layer CM may have a multilayer structure of Ti/Al/Ti.

A second planarization layer 119 may be disposed on the contact metal layer CM. The second planarization layer 119 may be formed in a single layer or a multilayer of a film including an organic material or an inorganic material. In some exemplary embodiments, the second planarization layer 119 may include the same material as that of the first planarization layer 117. In another exemplary embodiment, the second planarization layer 119 may include a material different from that of the first planarization layer 117. After the second planarization layer 119 is formed, chemical mechanical polishing may be performed to provide a planarized upper surface. In some exemplary embodiments, the second planarization layer 119 may be omitted.

The OLED including a pixel electrode 210, an intermediate layer 220, and an opposite electrode 230 may be disposed on the second planarization layer 119. The pixel electrode 210 may be electrically connected to the contact metal layer CM via a contact hole penetrating the second planarization layer 119, and the contact metal layer CM may be electrically connected to the source electrode 137 or the drain electrode 138, which are the connection electrodes of the TFT, via a contact hole penetrating the first planarization layer 117, so that the OLED may be electrically connected to the TFT.

The pixel electrode 210 may be disposed on the second planarization layer 119. The pixel electrode 210 may be a (semi-) transmissive electrode or a reflective electrode. The pixel electrode 210 may include a reflective film including Al, Pt, Pd, Ag, Mg, Au, Ni, Nd, Ir, Cr, Li, Ca, Mo, Ti, W, Cu, a compound thereof, or the like, and a transparent or semi-transparent electrode layer formed on the reflective film. The transparent or semi-transparent electrode layer may include at least one selected from the group consisting of an indium tin oxide (ITO), an indium zinc oxide (IZO), ZnO, indium oxide ($In_2O_3$), an indium gallium oxide (IGO), and an aluminum zinc oxide (AZO). The pixel electrode 210 may have a stack structure of ITO/Ag/ITO.

A bank layer 180 may be disposed on the second planarization layer 119, and the bank layer 180 may have an opening OP that exposes at least part of the pixel electrode 210. An area exposed by the opening OP of the bank layer 180 may be defined to be an emission area EA. The periphery of the emission area EA forms a non-emission area NEA, and the non-emission area NEA may surround the emission areas EA. In other words, the display area DA may include the emission areas EA and the non-emission area NEA surrounding the emission areas EA. The bank layer 180 may prevent generation of an arc or the like at an edge of the pixel electrode 210 by increasing the distance between the opposite electrodes 230 above the pixel electrode 210. The bank layer 180 may include an organic insulating material such as a polyimide, a polyamide, an acrylic resin, a benzocyclobutene, a hexamethyldisiloxane (HMDSO), a phenol resin, or the like.

In some exemplary embodiments, the bank layer 180 may include a photoresist, that is, a photosensitive resin. In detail, the bank layer 180 may include a negative photoresist. For example, the bank layer 180 may include an epoxy-based polymer or an off-stoichiometry thiol-enes (OSTE) polymer. In another exemplary embodiment, the bank layer 180 may include a positive photoresist.

The bank layer 180 may have liquid repellency. In some exemplary embodiments, an upper surface 180*a* of the bank layer 180 may have liquid repellency. In some exemplary embodiments, having liquid repellency may mean that, during an inkjet process, a contact angle with respect to a solvent constituting the ink including the organic material for forming the intermediate layer 220 that is described below, or with respect to the ink including an organic material, is greater than or equal to about 90°. In other words, having liquid repellency may means that, during an inkjet process, the contact angle with respect to a solvent constituting the ink including the organic material for forming the intermediate layer 220, or with respect to the ink including an organic material, is relatively large. As the upper surface 180*a* of the bank layer 180 has liquid repellency, during an inkjet process, the non-emission area NEA may be prevented or reduced from being coated with ink including an organic material. In another exemplary embodiment, not only the upper surface 180*a* of the bank layer 180, but also a lateral surface 180*b* of the bank layer 180 may have liquid repellency.

The bank layer 180 may include a fluorine resin. For example, the bank layer 180 may include an organic material having unsaturated bonding and a fluoro group. Alternatively, the bank layer 180 may include an organic material having unsaturated bonding and fluorine. The fluoro group or fluorine included in a surface of the bank layer 180 may improve liquid repellency of the upper surface 180*a* of the bank layer 180.

The intermediate layer 220 may be disposed on the pixel electrode 210 that is at least partially exposed by the bank layer 180. In other words, the intermediate layer 220 may be disposed in the opening OP defined in the bank layer 180. In some exemplary embodiments, the intermediate layer 220 may include an emission layer, a first functional layer and a second functional layer may be respectively disposed under and above the emission layer. The first functional layer, which is a constituent element disposed under the emission layer, may include a hole transport layer, or a hole transport layer and a hole injection layer. The second functional layer, which is a constituent element disposed above the emission layer, may include an electron transport layer, or an electron transport layer and an electron injection layer. The first functional layer and the second functional layer may be optionally respectively disposed under and above the emission layer.

The emission layer may include an organic material including a fluorescent or phosphorescent material emitting red, green, blue, or white light. The emission layer may include a low molecular organic material or a polymer organic material.

When the emission layer includes a low molecular organic material, layers of a hole injection layer, a hole transport layer, an electron transport layer, an electron injection layer, or the like may be disposed above and under the emission layer, and the emission layer may include, as the low molecular organic material, various organic materials such as copper phthalocyanine (CuPc), N,N'-Di (napthalene-1-yl)-N,N'-diphenyl-benzidine (NPB), tris-8-hydroxyquinoline aluminum (Alq3), or the like.

When the emission layer includes a polymer organic material, the hole transport layer may be disposed above or under the emission layer. In this state, the hole transport layer may include poly(3,4-ethylenedioxythiophene) PEDOT, and the emission layer may include a poly-phenylene vinylene (PPV) based polymer material, a polyfluorene based polymer material, or the like.

The intermediate layer 220 included in the display device 1 according to some exemplary embodiments may be formed in an inkjet printing process. In detail, the intermediate layer 220 according to some exemplary embodiments may be formed by discharging ink 450 containing an organic material (see FIG. 7) onto the pixel electrode 210. The ink 450 containing an organic material for forming the intermediate layer 220 is described in detail in the method of manufacturing a display device.

The opposite electrode 230 may be disposed on the intermediate layer 220. The opposite electrode 230 may be disposed on the intermediate layer 220 in a manner covering substantially the entirety of the intermediate layer 220. The opposite electrode 230 may be disposed above the display area DA in a manner covering substantially the entirety of the display area DA. In other words, the opposite electrode 230 may be integrally formed in the entirety of the display area DA to cover the pixels P disposed in the display area DA by using an open mask.

The opposite electrode 230 may include a conductive material having a low work function. For example, the opposite electrode 230 may include a (semi-) transparent layer including Ag, Mg, Al, Pt, Pd, Au, Ni, Nd, Ir, Cr, Li, Ca, or an alloy thereof, or the like. Alternatively, the opposite electrode 230 may further include a layer such as ITO, IZO, ZnO, or $In_2O_3$ on the (semi-) transparent layer including the above-described material.

The OLED may be covered by a thin film encapsulation layer. The thin film encapsulation layer may include at least one inorganic encapsulation layer and at least one organic encapsulation layer. The OLED may be covered by an encapsulation plate.

FIGS. 3 to 8 are cross-sectional views schematically illustrating an exemplary embodiment of a process of manufacturing a display device according to principles of the invention.

A method of manufacturing the display device 1 according to some exemplary embodiments is described in order with reference to FIGS. 3 to 8. Referring to FIGS. 3 to 8, the method of manufacturing the display device 1 according to some exemplary embodiments may include forming the pixel electrode 210 on the substrate 100, forming, on the pixel electrode 210, the bank layer 180 including the opening OP that exposes at least part of the pixel electrode 210, and forming the intermediate layer 220 by discharging the ink 450 containing an organic material onto the pixel electrode 210.

Furthermore, the method of manufacturing the display device 1 according to some exemplary embodiments may further include, after the forming of the intermediate layer 220 by discharging the ink 450 containing an organic material onto the pixel electrode 210, forming the opposite electrode 230 on the intermediate layer 220.

First, the TFT may be formed on the substrate 100. The TFT may include the semiconductor layer 134, the gate electrode 136, the source electrode 137, and the drain electrode 138. Furthermore, the buffer layer 107 may be formed on the substrate 100, and the first insulating layer 109, the second insulating layer 111, the third insulating layer 113, the first planarization layer 117, and the second planarization layer 119 may be sequentially formed on and above the buffer layer 107. For example, at least part of the first insulating layer 109, the second insulating layer 111, the third insulating layer 113, the first planarization layer 117, and the second planarization layer 119 may be omitted.

Figure 3:
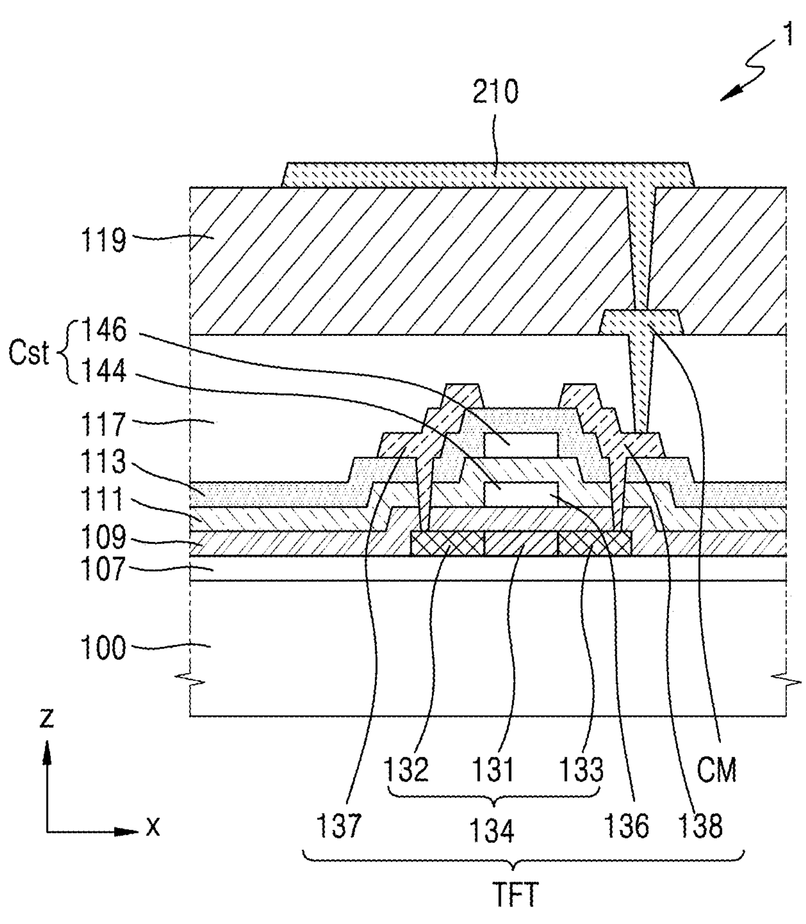
FIGS. 3 to 8 are cross-sectional views schematically illustrating an exemplary embodiment of a process of manufacturing a display device according to principles of the invention.

Referring to FIG. 3, the pixel electrode 210 may be formed on the second planarization layer 119. In some exemplary embodiments, the pixel electrode 210 may have a stacking structure of ITO/Ag/ITO.

After the forming of the pixel electrode 210 on the substrate 100, the forming of, the bank layer 180 on the pixel electrode 210, including the opening OP that exposes at least part of the pixel electrode 210, may be further performed.

In some exemplary embodiments, the forming of, on the pixel electrode 210, the bank layer 180 including the opening OP that exposes at least part of the pixel electrode 210 may include forming a photoresist layer 180M on the pixel electrode 210, exposing at least part of the photoresist layer 180M, forming the bank layer 180 by developing the photoresist layer 180M that is at least partially exposed, and heating the bank layer 180.

Figure 4:
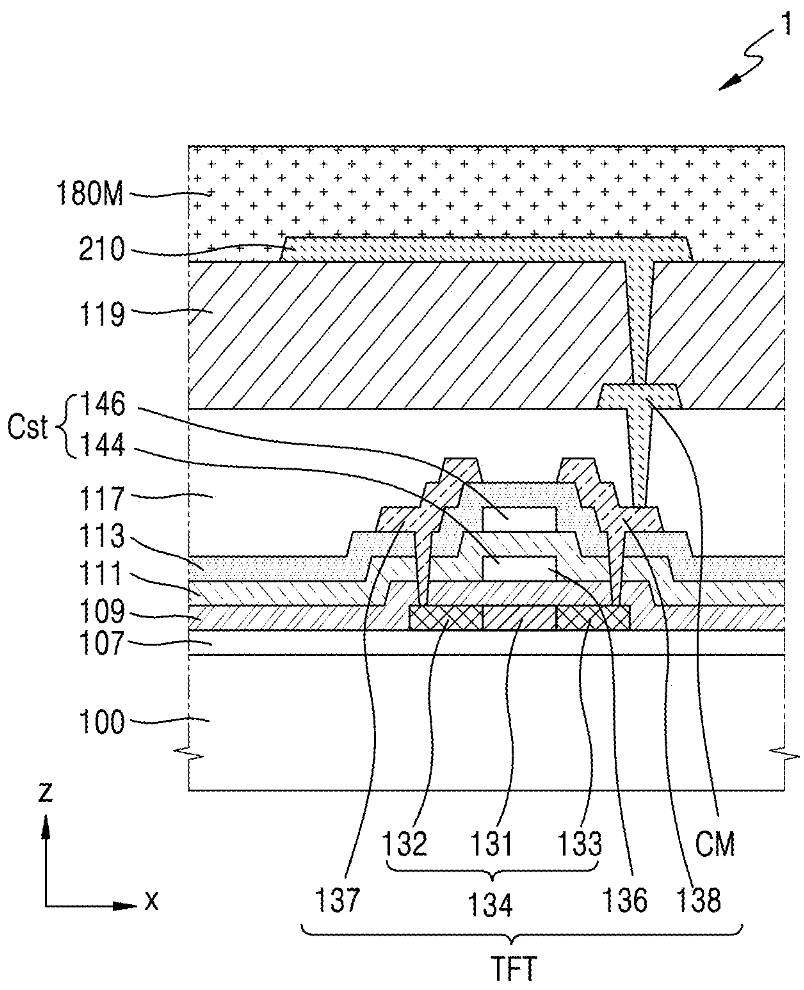

Referring to FIG. 4, after the forming of the pixel electrode 210 on the substrate 100, the forming of the photoresist layer 180M on the pixel electrode 210 may be performed.

The photoresist layer 180M may include photosensitive resin. For example, the photoresist layer 180M may include a negative photoresist. The photoresist layer 180M may include an organic insulating material such as a polyimide, a polyamide, an acrylic resin, a benzocyclobutene, an HMDSO, a phenol resin, or the like. Furthermore, the photoresist layer 180M may include an epoxy-based polymer or an off-stoichiometry thiol-enes (OSTE) polymer. In another exemplary embodiment, the photoresist layer 180M may include a positive photoresist.

The photoresist layer 180M may include a fluorine resin. For example, the photoresist layer 180M may include an organic material and a fluoro group having unsaturated bonding. Alternatively, the photoresist layer 180M may include an organic material and a fluorine having unsaturated bonding.

Figure 5:
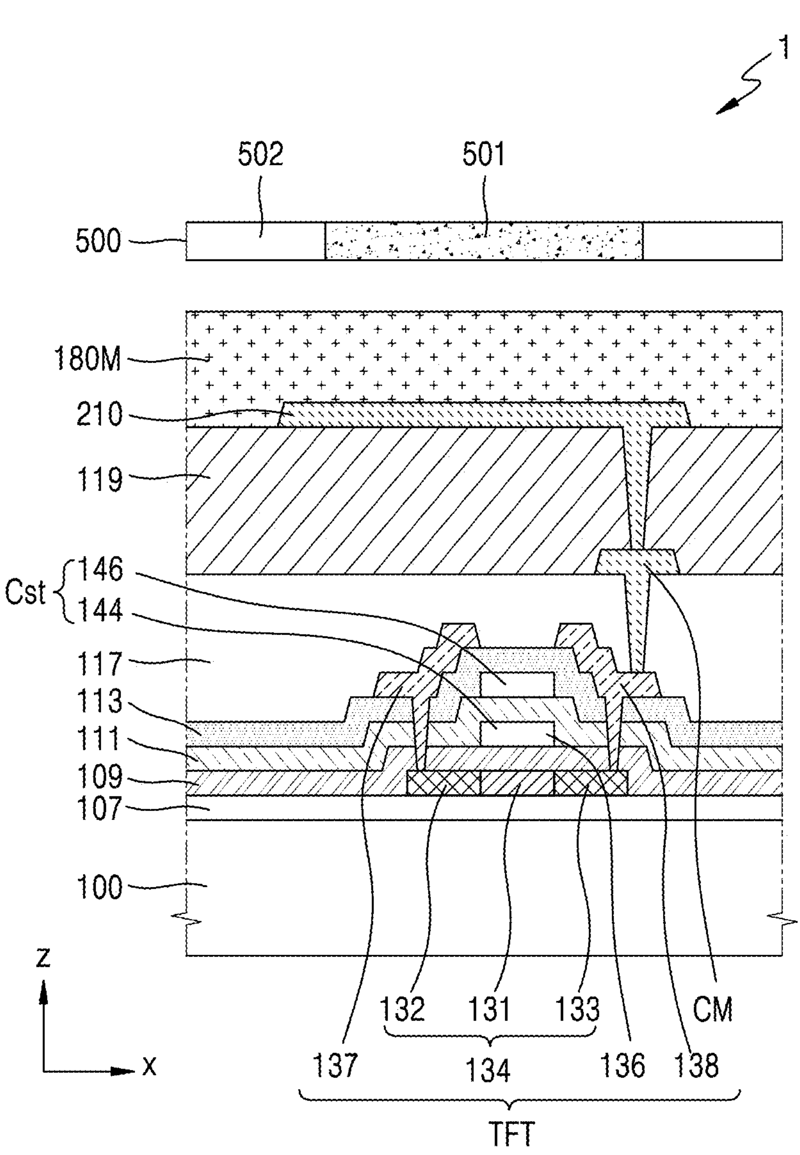

Referring to FIG. 5, after the forming of the photoresist layer 180M on the pixel electrode 210, exposing of at least part of the photoresist layer 180M may be performed. In the step of exposing of at least part of the photoresist layer 180M, at least part of the photoresist layer 180M may be exposed by using a mask 500 including a light shielding portion 501 and a light transmitting portion 502.

While a part of the photoresist layer 180M that overlaps with the light transmitting portion 502 of the mask 500 may be exposed, the rest of the photoresist layer 180M that overlaps with the light shielding portion 501 of the mask 500 may not be exposed.

Figure 6:
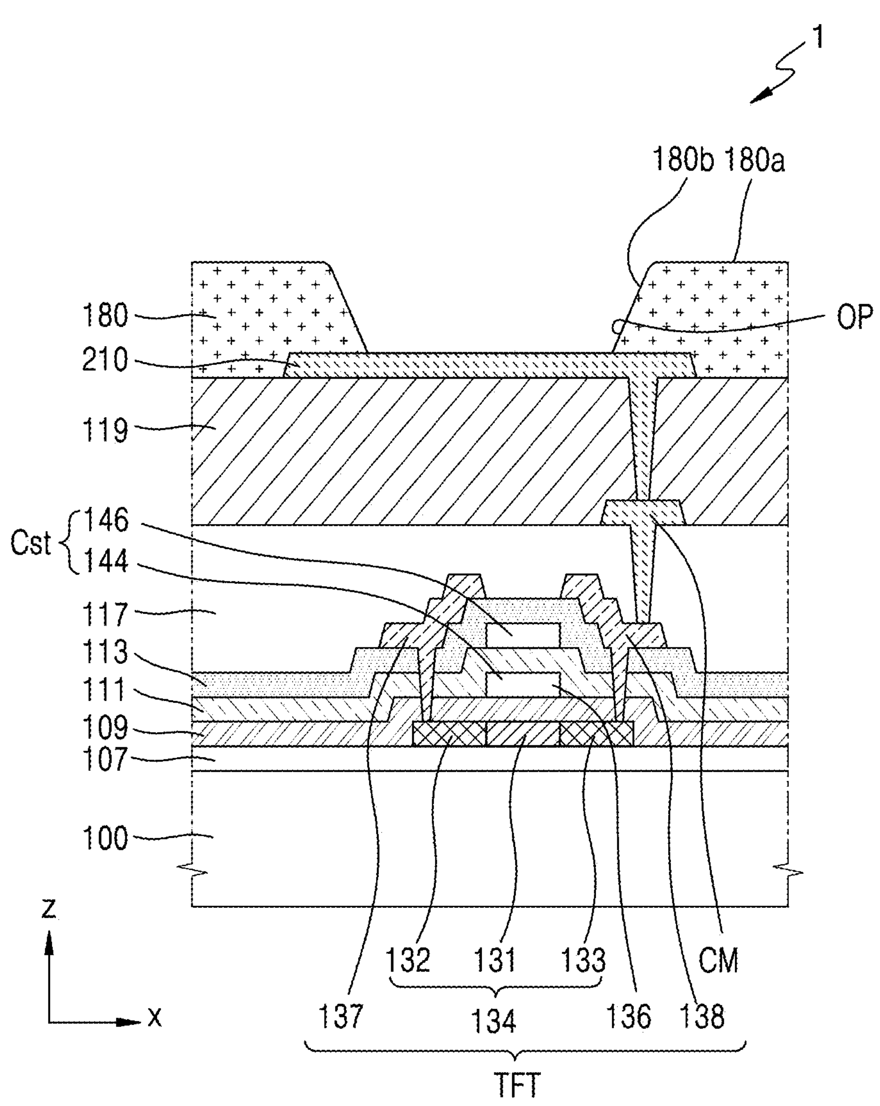

Referring to FIG. 6, after the exposing of the at least part of the photoresist layer 180M, the step of forming of the bank layer 180 by developing the photoresist layer 180M that is at least partially exposed may be performed.

In some exemplary embodiments, when the photoresist layer 180M include a negative photoresist, a portion overlapping with the light transmitting portion 502 of the mask 500 may be formed as the bank layer 180, and a portion overlapping with the light shielding portion 501 of the mask 500 may be formed as the opening OP. In another exemplary embodiment, when the photoresist layer 180M includes a positive photoresist, the portion overlapping with the light transmitting portion 502 of the mask 500 may be formed as the opening OP. The portion overlapping with the light shielding portion 501 of the mask 500 may be formed as the bank layer 180.

After the forming of the bank layer 180 by developing the photoresist layer 180M that is at least partially exposed, the step of heating of the bank layer 180 may be performed. During the heating of the bank layer 180, a liquid repellent material or a hydrophobic material included in the bank layer 180 may rise to be the upper surface 180*a* of the bank layer 180. Accordingly, the upper surface 180*a* of the bank layer 180 may have liquid repellency, and the lateral surface 180*b* of the bank layer 180 may not have liquid repellency. In another exemplary embodiment, not only the upper surface 180*a* of the bank layer 180, but also the lateral surface 180*b* of the bank layer 180, may have liquid repellency.

The bank layer 180 may include a fluorine resin. For example, the bank layer 180 may include an organic material and a fluoro group having unsaturated bonding. Alternatively, the bank layer 180 may include an organic material and a fluorine having unsaturated bonding. The fluoro group or fluorine included in the surface of the bank layer 180 may improve liquid repellency of the upper surface 180*a* of the bank layer 180.

Figure 7:
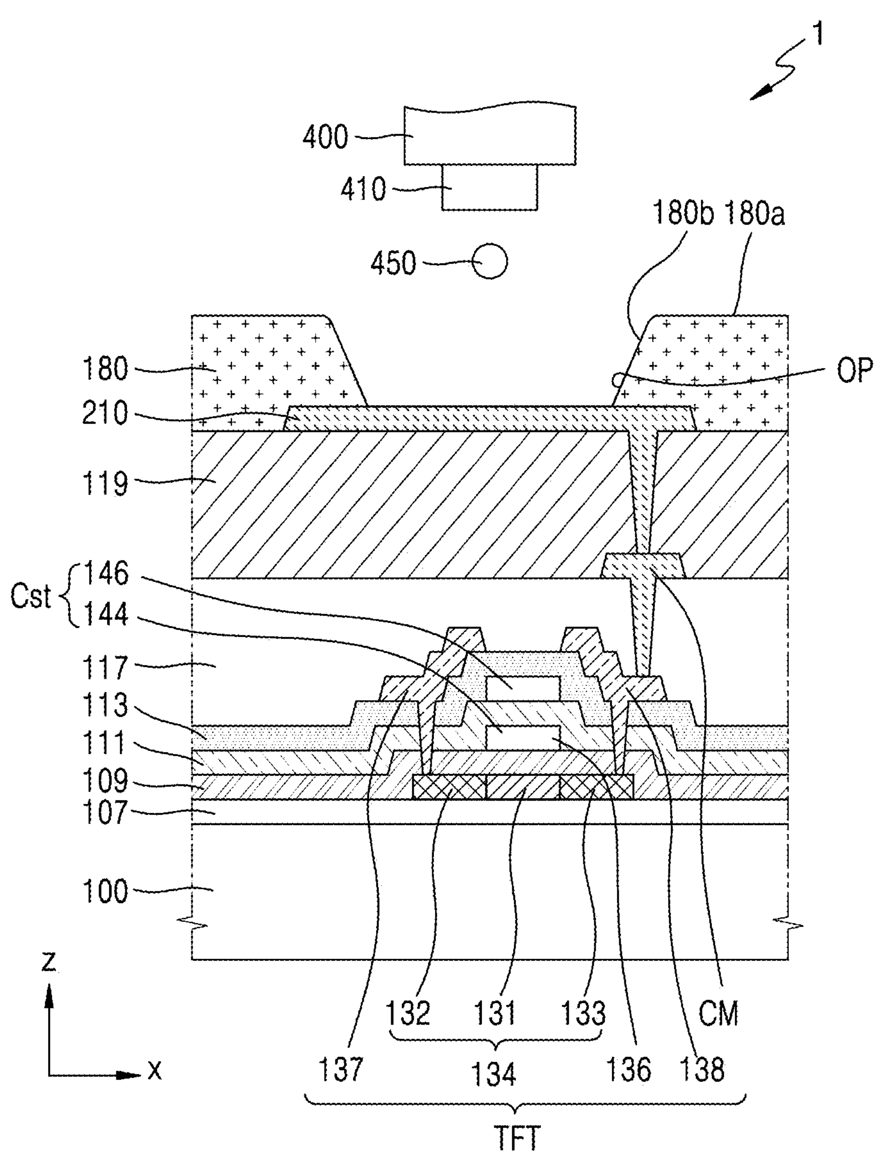
Figure 8:
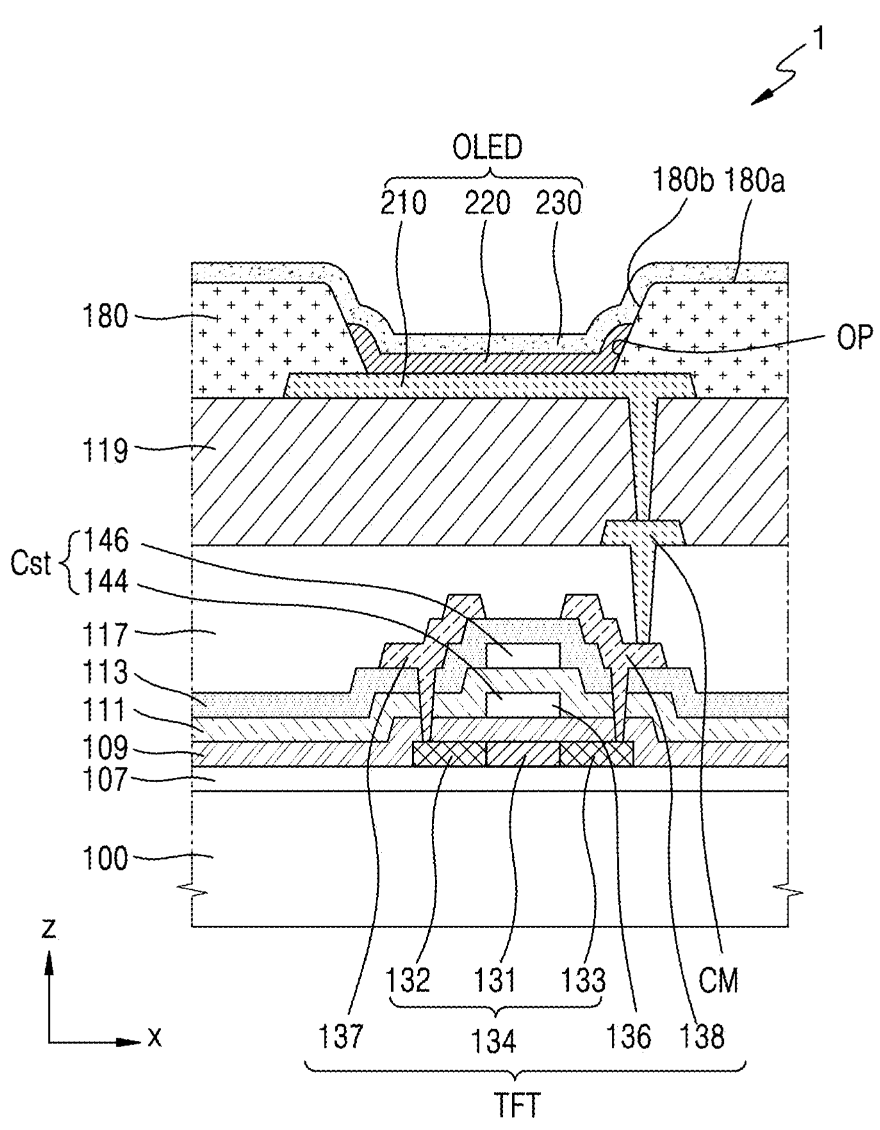

Referring to FIG. 7, after the step of forming of the bank layer 180, on the pixel electrode 210, including the opening OP that exposes at least part of the pixel electrode 210, the step of forming of the intermediate layer 220 by discharging the ink 450 containing an organic material onto the pixel electrode 210 may be performed.

The intermediate layer 220 according to some exemplary embodiments may be formed through an inkjet printing process. In detail, as the ink 450 containing an organic material is discharged from an ink discharge portion 400 including a nozzle 410 onto the pixel electrode 210, the intermediate layer 220 may be formed.

The ink 450 discharged from the ink discharge portion 400 may include an organic material. The molecular weight of the organic material contained in the ink 450 may have a range of greater than about 500 and less than about 1,000,000, and various modifications are possible, for example, the molecular weight of the organic material contained in the ink 450 may have a range of greater than about 500 and less than about 400,000, a range of greater than about 500 and less than about 300,000, or the like.

For example, when the molecular weight of the organic material contained in the ink 450 is less than about 500, a problem may occur during heating in that the organic material spreads to adjacent pixels to contaminate the adjacent pixels. Furthermore, when the molecular weight of the organic material contained in the ink 450 is high, the viscosity of the ink 450 increases so that it may be difficult to adjust the amount of the ink 450 discharged from the ink discharge portion 400. Accordingly, when the molecular weight of the organic material contained in the ink 450 has a range of greater than about 500 and less than about 1,000,000, the contamination of adjacent pixels due to the organic material spreads to the adjacent pixels may be substantially reduced or prevented, and as the amount of the ink 450 discharged from the ink discharge portion 400 is efficiently controlled, the display device 1 may have a high resolution.

To produce a display device 1 of a high resolution, the amount of the ink 450 discharged from the ink discharge portion 400 is reduced, and the concentration of the ink 450 is increased. However, when the concentration of the ink 450 is increased, the viscosity of the ink 450 increases so that it is difficult to reduce the discharge amount of the ink 450.

An Ohnesorge number Oh is used as a dimensionless number of fluid properties to solve the fluid's Navier-stokes equation and establish a fluid dynamics model for the inkjet printing process. The Ohnesorge number Oh is defined as in Mathematical Formula 1 below $$Oh = \frac{\eta}{\sqrt{\rho\sigma d}} \quad \text{(Mathematical Formula 1)}$$

where η denotes viscosity, ρ denotes density, σ denotes surface tension, and d denotes the diameter of a nozzle.

In general, when the Ohnesorge number Oh of ink used for a drop on demand (DOD) type inkjet printing process is great, as the viscosity of ink serves as a dominant factor, a large pressure is needed for discharging the ink, the speed of ink decreases, and the tail of the ink is elongated, so that the resolution of a display device may deteriorate. In some exemplary embodiments, to produce a display device 1 having a high resolution, the Ohnesorge number Oh of the ink 450 containing an organic material may be less than about 1. To produce a display device 1 having a high resolution, ink is discharged under about 3 picoliter (pL), and the maximum viscosity that is dischargeable at about 3 pL may be induced as follows.

Assuming that, at a temperature of about 15° C. to about 50° C., the density of the ink containing an organic material is about 0.99 g/cm$^3$, surface tension is about 34.5 mN/m, and the diameter of a nozzle is about 18 μm, when the Ohnesorge number Oh of the ink 450 is less than about 1, the maximum viscosity that is dischargeable at about 3 pL may be calculated to be about 25 centipoise (cP).

According to some exemplary embodiments, the viscosity of the ink 450 containing an organic material may be less than or equal to about 25 cP. As the ink 450 containing an organic material has viscosity of less than or equal to about 25 cP, the ink 450 may be discharged under about 3 pL, and thus a high resolution display device may be produced. However, to induce the maximum viscosity that is dischargeable at about 3 pL, it is assumed that the density of the ink containing an organic material is about 0.99 g/cm$^3$, surface tension is about 34.5 mN/m, and the diameter of a nozzle is about 18 um, but the exemplary embodiments are not limited thereto. In some exemplary embodiments, the surface tension of the ink used for an inkjet printing process may be about 20 mN/m to about 50 mN/m, and the diameter of a nozzle may be about 10 μm to about 30 μm. For example, as the density, the surface tension, and the diameter of a nozzle of the ink containing an organic material may be variously changed, the maximum viscosity that is dischargeable at about 3 pL, which is about 25 cP, may be changed as well.

Figure 9:
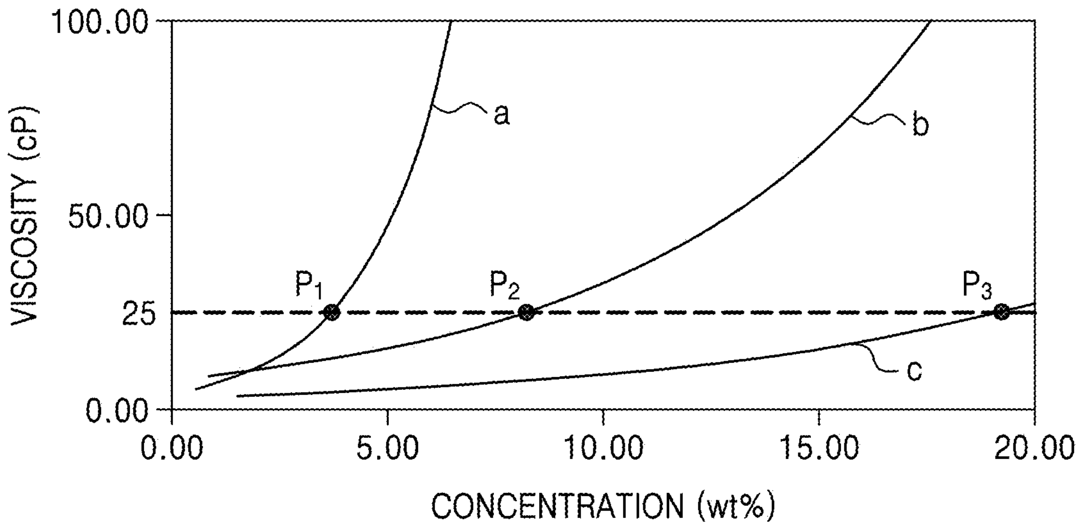
FIG. 9 is a graphical depiction of some comparative and exemplary embodiments comparing viscosity with concentration of ink for each molecular weight.
Figure 10:
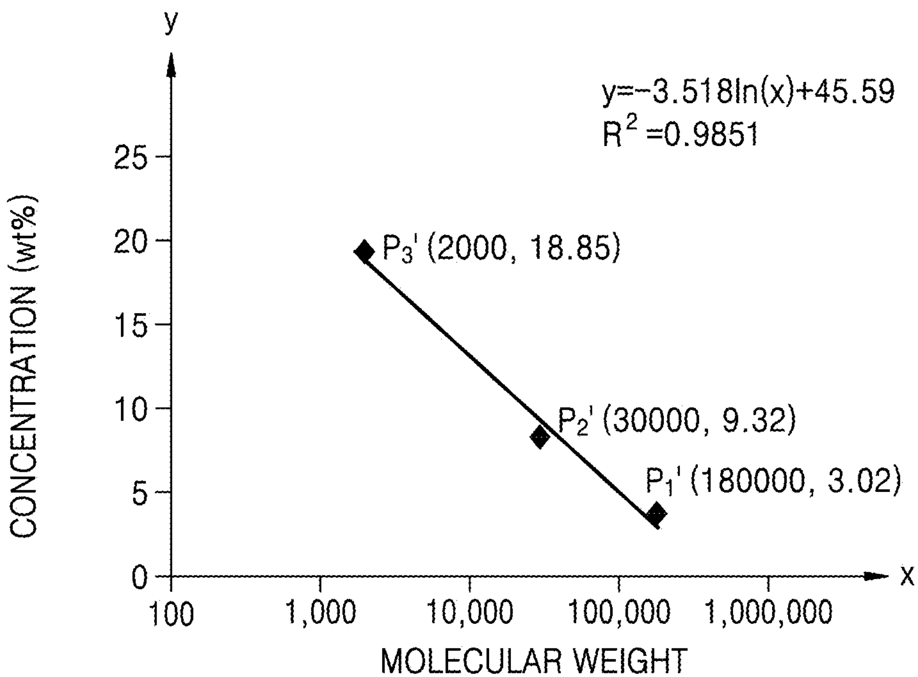
FIG. 10 is a graphical depiction of some exemplary embodiments comparing molecular weight versus concentration when the viscosity of ink is less than or equal to about 25 cP according to principles of the invention.

FIG. 9 is a graphical depiction of some comparative and exemplary embodiments comparing viscosity with concentration of ink for each molecular weight. FIG. 10 is a graphical depiction of some exemplary embodiments comparing molecular weight versus concentration when the viscosity of ink is less than or equal to about 25 cP according to principles of the invention.

In detail, in FIG. 9, the curve "a" indicates viscosity versus concentration when the molecular weight of the organic material contained in the ink is 180,000, the curve "b" indicates viscosity versus concentration when the molecular weight of the organic material contained in the ink is 30,000, and the curve "c" indicates viscosity versus concentration when the molecular weight of the organic material contained in the ink is 2,000. In FIG. 10, the graph indicates the concentration according to the viscosity versus the molecular weight and the relation between the concentration and the molecular weight in which the viscosity of ink is less than or equal to 25 cP in the viscosity graph according to concentration for each molecular weight FIG. 9. In this state, FIGS. 9 and 10, respectively show a graph indicating the viscosity versus concentration of ink for each molecular weight at a temperature of 15° C. to 50° C., and a graph indicating the concentration according to the viscosity versus molecular weight to deduce the relation between the molecular weight and the concentration in which the viscosity of the ink is less than or equal to 25 cP.

Referring to FIGS. 9 and 10, as the maximum viscosity that is dischargeable at 3 pL is 25 cP, assuming that, when the viscosity is 25 cP, a coordinate of the curve "a" is $P_1$, a coordinate of the curve "b" is $P_2$, and a coordinate of the curve "c" is $P_3$, the coordinate of $P_1$ is (3.02, 25), the coordinate of $P_2$ is (9.32, 25), and the coordinate of $P_3$ is (18.85, 25). Accordingly, when the viscosity is 25 cP, the concentration for each molecular weight may be 3.02 wt % when the molecular weight is 180,000, 9.32 wt % when the molecular weight is 30,000, and 18.85 wt % when the molecular weight is 2,000.

To deduce the relation between the molecular weight and the concentration, a graph of the viscosity according to the concentration may be converted to a graph of the concentration according to the molecular weight as shown in FIG. 10, by using a value deduced through the graph of FIG. 9. For example, $P_1'$, $P_2'$, and $P_3'$ of FIG. 10 may respectively correspond to $P_1$, $P_2$, and $P_3$ of FIG. 9. When the molecular weight is 180,000, the concentration is 3.02 wt %, and thus the coordinate of $P_1'$ is (180000, 3.02), when the molecular weight is 30,000, the concentration is 9.32 wt %, and thus the coordinate of $P_2'$ is (30000, 9.32), and when the molecular weight is 2,000, the concentration is 18.85 wt %, and thus the coordinate of $P_3'$ is (2000, 18.85).

Mathematical Formula 2 below may be deduced by using the coordinate of P1', the coordinate of P2', and the coordinate of P3' that are calculated as above.

$$y = -3.518 * \ln(x) + 45.59 \quad \text{Mathematical Formula 2}$$

In Mathematical Formula 2, y denotes the concentration of a light-emitting material contained in the ink, and x denotes the molecular weight of the light-emitting material contained in the ink. Furthermore, a coefficient of determination $R^2$ of Mathematical Formula 2 may be 0.9851.

Furthermore, to produce a display device 1 having a high resolution, the viscosity of the ink 450 containing an organic material may be less than or equal to 25 cP at a temperature of 15° C. to 50° C., and thus the molecular weight and the concentration of the ink may be expressed as in Mathematical Formula 3 below.

$$y < -3.518 * \ln(x) + 45.59 \quad \text{Mathematical Formula 3}$$

In Mathematical Formula 3, y denotes the concentration of a light-emitting material contained in the ink, and x denotes the molecular weight of the light-emitting material contained in the ink.

Accordingly, when the molecular weight of the ink 450 is greater than 500, and the viscosity and molecular weight of the ink satisfy Mathematical Formula 3, the amount of the ink 450 discharged in the inkjet printing process may be reduced, and thus a high resolution display device may be produced.

Referring back to FIG. 8, after the step of forming of the intermediate layer 220 by discharging the ink 450 including a light-emitting material onto the pixel electrode 210, the step of forming of the opposite electrode 230 on the intermediate layer 220 may be performed.

The opposite electrode 230 may be formed on the intermediate layer 220 in a manner covering substantially the entirety of the intermediate layer 220 and the bank layer 180. The opposite electrode 230 may be formed integrally in substantially the entirety of a display area to cover a plurality of pixels disposed in the display area.

The OLED may be covered by the thin film encapsulation layer. The thin film encapsulation layer may include at least one inorganic encapsulation layer and at least one organic encapsulation layer. In another exemplary embodiment, the OLED may be covered by the encapsulation plate.

According to some exemplary embodiments, as the organic material included in the intermediate layer 220 has a molecular weight greater than about 500, during heating, contamination of adjacent pixels may be substantially reduced of prevented.

Furthermore, when the concentration and the molecular weight of the ink containing an organic material satisfy Mathematical Formula 3, the amount of the ink discharged in the inkjet printing process may be reduced so that a high resolution display device may be produced.

Display devices constructed according to the principles of and exemplary implementations of the invention and in exemplary methods of manufacturing display devices according to the principles of the invention as the upper surface or lateral surface of the bank layer 180 has liquid repellency, coating of the non-display area with the ink containing an organic material may be prevented or reduced. Furthermore, as intermediate layer 220 is formed through the inkjet printing process, the efficiency of the display device manufacturing process may be improved. According to some exemplary embodiments, as the concentration of ink and the molecular weight of the organic material are deduced through a correlation between the viscosity of ink, the concentration of ink, and the molecular weight of the organic material contained in the ink, the reliability of the display device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An ink for a display device, the ink comprising:

an organic material, wherein the organic material has a molecular weight greater than about 2000 and less than about 30000, and the organic material in the ink has a concentration and the molecular weight of the organic material satisfy:

$$y < -3.518 * \ln(x) + 45.59,$$

wherein y is the concentration of the organic material, and x is the molecular weight of the organic material.

2. The ink of claim 1, wherein the ink has an Ohnesorge number of less than about 1.

3. The ink of claim 1, wherein viscosity of the ink is less than or equal to about 25 cP.

4. A display device comprising:

a substrate;

a pixel electrode disposed on the substrate;

an opposite electrode disposed on the pixel electrode; and an intermediate layer disposed between the pixel electrode and the opposite electrode and comprising an organic material, wherein the organic material has a molecular weight greater than about 2000 and less than about 30000, and the organic material comprises ink having a concentration and the molecular weight of the organic material satisfy:

$$y < -3.518 * \ln(x) + 45.59,$$

wherein y is the concentration of the organic material, and x is the molecular weight of the organic material.

5. The display device of claim 4, wherein the ink has an Ohnesorge number of less than about 1.

6. The display device of claim 4, wherein viscosity of the ink is less than or equal to about 25 cP.

7. The display device of claim 4, wherein the opposite electrode covers the intermediate layer.

* * * * *